(12) United States Patent
Ryoo et al.

(10) Patent No.: US 7,436,042 B2
(45) Date of Patent: Oct. 14, 2008

(54) CIRCUIT FOR DRIVING GATE OF POWER MOSFET

(75) Inventors: Tae Ha Ryoo, Daejeon (KR); Byung Tak Jang, Daejeon (KR)

(73) Assignee: DMB Technologies Co., Ltd., Daejeon (KR)

( * ) Notice: Subject to any disclaimer, the term of this patent is extended or adjusted under 35 U.S.C. 154(b) by 739 days.

(21) Appl. No.: 10/529,695

(22) PCT Filed: Sep. 29, 2003

(86) PCT No.: PCT/KR03/01984

§ 371 (c)(1),
(2), (4) Date: Mar. 28, 2005

(87) PCT Pub. No.: WO2004/030212

PCT Pub. Date: Apr. 8, 2004

(65) Prior Publication Data

US 2005/0269631 A1    Dec. 8, 2005

(30) Foreign Application Priority Data

Sep. 30, 2002   (KR) .................. 10-2002-0059398

(51) Int. Cl.
*H01L 29/93* (2006.01)
(52) U.S. Cl. ........................................ 257/499; 257/528
(58) Field of Classification Search .................. 257/499, 257/528
See application file for complete search history.

(56) References Cited

OTHER PUBLICATIONS

International Search Report in corresponding International Application PCT/KR03/01984.

*Primary Examiner*—Douglas M Menz
(74) *Attorney, Agent, or Firm*—Jones Day

(57) ABSTRACT

A circuit for driving a gate of a power metal-oxide semiconductor field effect transistor (MOSFET), which uses a higher voltage than a gate controller is provided. The circuit is able to safely and effectively transmits an output signal of a gate controller irrespective of a frequency and a duty-cycle of the output signal when transmitting the output signal of the gate controller to the power MOSFET using a higher voltage than the gate controller. Accordingly, the circuit is suitable for a case where the duty-cycle of the output signal of the gate controller dramatically changes and the frequency is irregular.

8 Claims, 5 Drawing Sheets

CIRCUIT FOR DRIVING GATE OF POWER MOSFET

FIELD OF THE INVENTION

The present invention relates to a circuit for driving a gate of a power metal-oxide semiconductor field effect transistor (MOSFET) in a digital audio amplifier, and more particularly, to a circuit for driving a gate of a power MOSFET using a higher voltage than a gate controller which controls the gate of the power MOSFET.

BACKGROUND OF THE INVENTION

FIG. 1 is a drawing illustrating a conventional circuit for driving a gate of a power metal-oxide semiconductor field effect transistor (MOSFET) in a digital audio amplifier. Referring to FIG. 1, a first power source voltage $V_{DD}$, that is, a positive power source voltage, is applied to a source of a power PMOSFET transistor PM and a second power source voltage $V_{SS}$, that is, a negative power source voltage, is applied to a source of a power NMOSFET transistor NM. A gate controller 11 uses a third power source voltage $V_{CC}$, which is lower than the first power source voltage $V_{DD}$, and a fourth power source voltage $V_{EE}$, which is lower than the second power source voltage $V_{SS}$.

In a conventional circuit for driving a gate 13, capacitors $C_1$ and $C_2$ are generally used to maintain a voltage difference between the gate controller 11 and the power MOSFET transistors PM and NM, and to transmit an output signal of the gate controller 11 to the power MOSFET transistors PM and NM. In addition, resistances $R_1$ and $R_2$ are further included to charge and discharge the capacitors $C_1$ and $C_2$.

FIGS. 2A through 2C illustrate voltages of main nodes $V_{GC}$, $V_{GP}$, and $V_{GN}$ of the circuit of FIG. 1 when a duty-cycle is very small.

The conventional circuit for driving the gate 13 does not have a problem in operating when the duty-cycle of the output signal $V_{GC}$ of the gate controller 11 is in a range of about 50%. However, when the duty-cycle of the output signal $V_{GC}$ of the gate controller 11 is beyond 50%, an on resistance is decreased in one of the power MOSFET transistors PM and NM, while the on resistance is increased in the other of the power MOSFET transistors PM and NM. That is, as shown in FIG. 2B, an amplitude of a gate signal $V_{GP}$ of the power PMOSFET transistor PM is equal to an amplitude of the output signal $V_{GC}$ of the gate controller 11, that is, $V_{CC}$-$V_{EE}$. However, the gate signal $V_{GP}$ goes only a little down from a source potential $V_{DD}$, drops slightly and thus, an effective gate voltage, which may turn the power PMOSFET transistor PM on, becomes small. Therefore, the power PMOSFET transistor PM is not turned on, or even if it is turned on, the power PMOSFET transistor PM has large resistance.

On the contrary, when the duty-cycle is very large, the power NMOSFET transistor NM is not turned on, or even if it is turned on, the power NMOSFET transistor NM has large resistance. That is, operation of the conventional circuit for driving the gate depends on the frequency and duty-cycle of the output signal of the gate controller 11, and when the duty-cycle is very small or large, the power MOSFET transistors cannot safely nor effectively operate.

SUMMARY OF THE INVENTION

To solve the above and other problems, the present invention provides a circuit for driving a gate, which safely and effectively drives power MOSFET transistors irrespective of a frequency and duty-cycle of a gate controller, especially when the power MOSFET transistors use a higher voltage than the gate controller.

According to an aspect of the present invention, there is provided a circuit for driving a gate of a power MOSFET in a digital audio amplifier, which includes a power PMOSFET transistor in which a first power source voltage is applied to a source and an output terminal is connected to a drain; a power NMOSFET transistor in which the output terminal is connected to a drain and a second power source voltage is applied to a source; a gate controller which uses a third power source voltage which is lower than the first power source voltage and a fourth power source voltage which is lower than the second power source voltage, and controls gates of the power PMOSFET and NMOSFET transistors; and an output filter which is connected to the output terminal and has an inductor and a capacitor, the circuit comprising: a first resistance connected between the first power source voltage and the gate of the power PMOSFET transistor; a second resistance connected between the second power source voltage and the gate of the power NMOSFET transistor; a first capacitor connected between an output terminal of the gate controller and the gate of the power PMOSFET transistor; a second capacitor connected between the output terminal of the gate controller and the gate of the power NMOSFET transistor; a first diode connected between the output terminal of the gate controller and the gate of the power PMOSFET transistor; and a second diode connected between the output terminal of the gate controller and the gate of the power NMOSFET transistor.

According to another aspect of the present invention, there is provided a circuit for driving a gate of a power MOSFET in a digital audio amplifier, which includes a power PMOSFET transistor in which a first power source voltage is applied to a source and an output terminal is connected to a drain; a power NMOSFET transistor in which the output terminal is connected to a drain and a second power source voltage is applied to a source; a gate controller which use a third power source voltage lower than the first power source voltage and a fourth power source voltage lower than the second power source voltage, and controls gates of the power PMOSFET and NMOSFET transistors; and an output filter which is connected to the output terminal and has an inductor and a capacitor, the circuit comprising: a first resistance connected between the first power source voltage and the gate of the power PMOSFET transistor; a second resistance connected between the second power source voltage and the gate of the power NMOSFET transistor; a first capacitor connected between the output terminal of the gate controller and the gate of the power PMOSFET transistor; a second capacitor connected between the output terminal of the gate controller and the gate of the power NMOSFET transistor; a first diode, one end of which is connected to the first power source voltage; a second diode, one end of which is connected to the other end of the first diode and other end of which is connected to the gate of the power PMOSFET transistor; a third diode, one end of which is connected to the second power source voltage and other end of which is connected to the gate of the power PMOSFET transistor; and a fourth diode, one end of which is connected to other end of the third diode and other end of which is connected to the gate of the power NMOSFET transistor.

According to still another aspect of the present invention, there is provided a circuit for driving a gate of a power MOSFET in a digital audio amplifier, which includes a power PMOSFET transistor in which a first power source voltage is applied to a source and an output terminal is connected to a drain; a power NMOSFET transistor in which the output terminal is connected to a drain and a second power source voltage is applied to a source; a gate controller which use a third power source voltage which is lower than the first power source voltage and a fourth power source voltage which is lower than the second power source voltage, and controls gates of the power PMOSFET and NMOSFET transistors; and an output filter which is connected to the output terminal and has an inductor and a capacitor, the circuit comprising: a first resistance connected between the first power source voltage and the gate of the power PMOSFET transistor; a second resistance connected between the second power source voltage and the gate of the power NMOSFET transistor; a first capacitor, one end of which is connected the output terminal of the gate controller; a second capacitor, one end of which is connected to the output terminal of the gate controller; a first diode, one end of which is connected to the first power source voltage and other end of which is connected to the gate of the power PMOSFET transistor; a second diode, one end of which is connected to other end of the first capacitor and other end of which is connected to the gate of the power PMOSFET transistor; a third diode, one end of which is connected to the second power source voltage and other end of which is connected to the gate of the power NMOSFET transistor; and a fourth diode, one end of which is connected to other end of the second capacitor and other end of which is connected to the gate of the power NMOSFET transistor.

The circuit for driving the gate according to the another or still another aspect of the present invention may further comprise a current source which is connected to the gates of the power PMOSFET and NMOSFET transistors and the output terminal of the gate controller.

Accordingly, the circuit for driving the gate according to present invention has an advantage in that the circuit safely and effectively transmits the output signal of the gate controller irrespective of the frequency and duty-cycle of the output signal when transmitting the output signal of the gate controller to the power MOSFET transistor using a higher power source voltage than the gate controller.

DETAILED DESCRIPTION OF THE PREFERRED EMBODIMENTS

Figure 1:
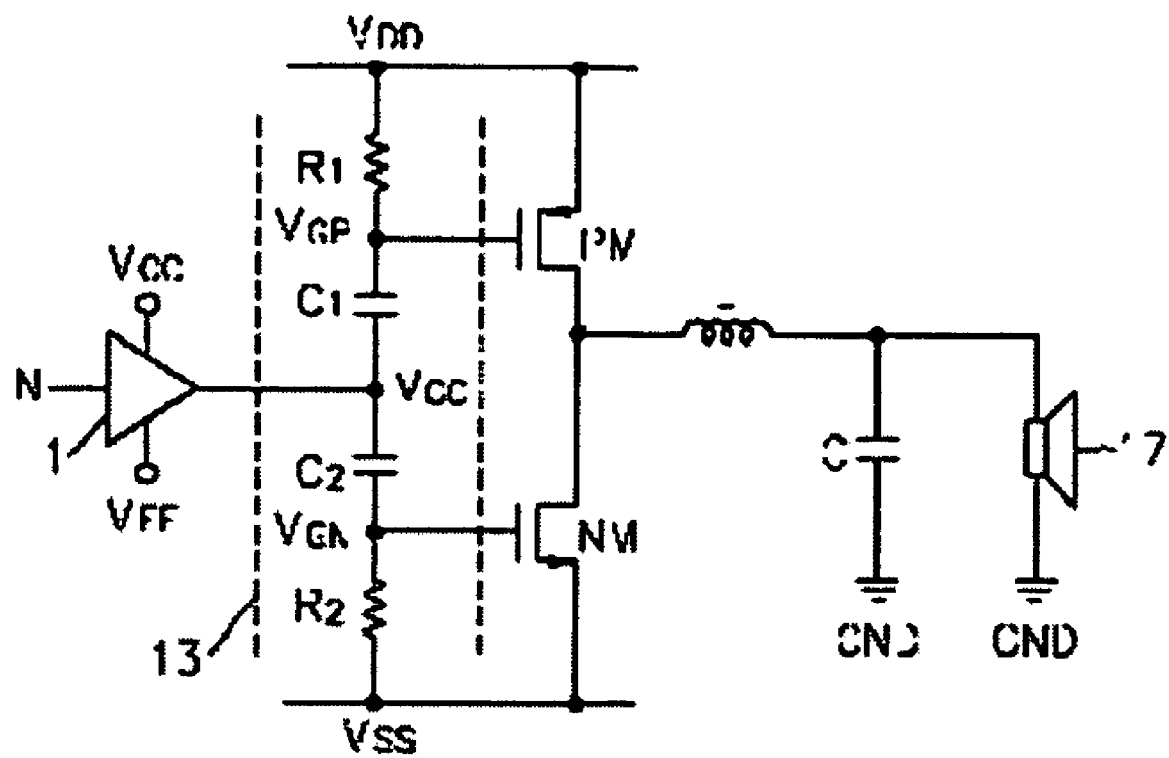
FIG. 1 is a drawing illustrating a conventional circuit for driving a gate of a power metal-oxide semiconductor field effect transistor (MOSFET) in a digital audio amplifier.
Figure 2A:
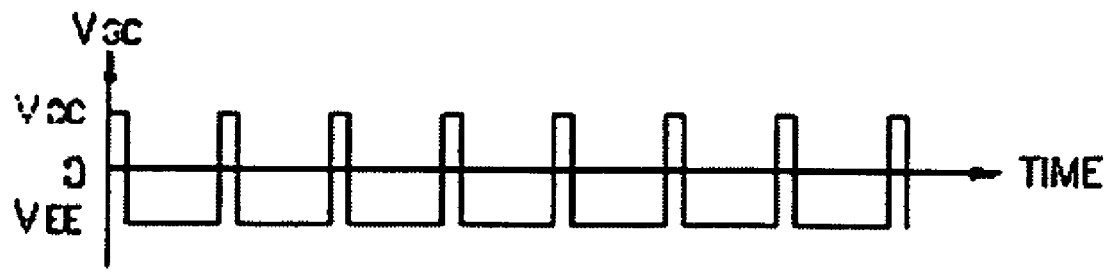
FIGS. 2A through 2C illustrate voltages of main nodes $V_{GC}$, $V_{GP}$, and $V_{GN}$ of the circuit of FIG. 1 when a duty-cycle is very small.
Figure 2B:
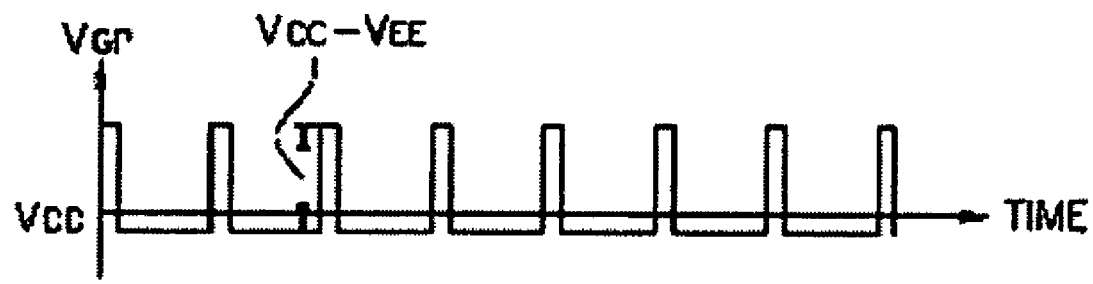
Figure 2C:
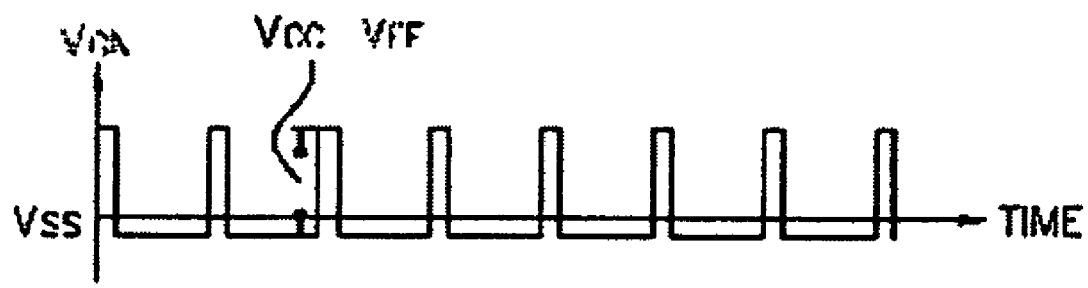

The present invention will now be described more fully with reference to accompanying drawings in which exemplary embodiments of the present invention are shown. To facilitate understanding, identical reference numerals have been used, where possible, to designate identical elements that are common to the figures.

Figure 3:
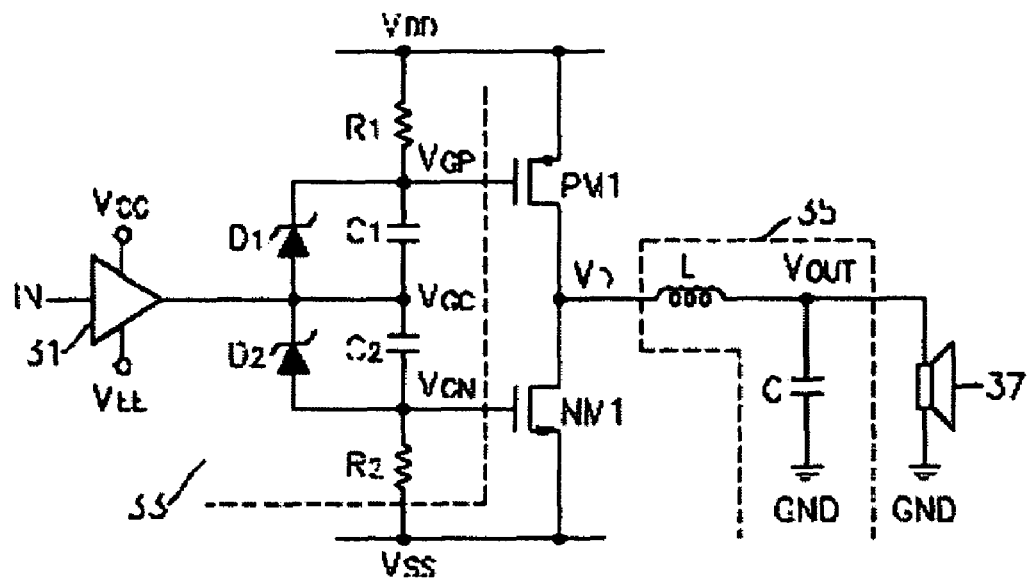
FIG. 3 is a drawing illustrating a circuit for driving a gate of a power MOSFET in a digital audio amplifier, according to a first embodiment of the present invention.

FIG. 3 is a drawing illustrating a circuit for driving a gate of a power MOSFET in a digital audio amplifier, according to a first embodiment of the present invention.

Referring to FIG. 3, a first power source voltage $V_{DD}$, that is, a positive power source voltage, is applied to a source of a power PMOSFET transistor $PM_1$ and a second power source voltage $V_{SS}$, that is, a negative power source voltage, is applied to a source of a power NMOSFET transistor $NM_1$. A gate controller 31 uses a third power source voltage $V_{CC}$, which is lower than the first power source voltage $V_{DD}$ and a fourth power source voltage $V_{EE}$, which is lower than the second power source voltage $V_{SS}$. A filter 35, which is formed of an inductor L and a capacitor C, is connected to an output terminal $V_D$, that is, a connecting point between the power PMOSFET transistor $PM_1$ and the power NMOSFET transistor $NM_1$, and an output terminal $V_{OUT}$ of the filter 35 is connected to a speaker 37.

A circuit for driving a gate 33 comprises a first resistance $R_1$, which is connected between the first power source voltage $V_{DD}$ and a gate of the power PMOSFET transistor $PM_1$, a second resistance $R_2$, which is connected between the second power source voltage $V_{SS}$ and a gate of the power NMOSFET transistor $NM_1$, a first capacitor $C_1$, which is connected between an output terminal of a gate controller 31 and the gate of the power PMOSFET transistor $PM_1$, a second capacitor $C_2$, which is connected between the output terminal of the gate controller 31 and the gate of the power NMOSFET transistor $NM_1$, a first diode $D_1$, which is connected between the output terminal of the gate controller 31 and the gate of the power PMOSFET transistor $PM_1$, and a second diode $D_2$, which is connected between the output terminal of the gate controller 31 and the gate of the power NMOSFET transistor $NM_1$.

The first and second diodes $D_1$ and $D_2$ may be general diodes, but they are preferably zener diodes.

Specifically, the diodes $D_1$ and $D_2$ are connected to the capacitors $C_1$ $_{and\ C2}$ in parallel in order to prevent the capacitors $C_1$ and $C_2$ from being overcharged. Typically, while the capacitors $C_1$ and $C_2$ compensate for voltage differences between the gate controller 31 and the power MOSFET transistors $PM_1$ and $NM_1$, the capacitors $C_1$ $_{and\ C2}$ transmit a signal component intact. Therefore, a voltage corresponding to a difference between the first power source voltage $V_{DD}$ and the third power source voltage $V_{CC}$ is charged in the capacitor $C_1$, which is connected between the gate controller 31 and the power PMOSFET transistor $PM_1$, and a voltage corresponding to a difference between the second power source voltage $V_{SS}$ and the fourth power source voltage $V_{EE}$ is charged in the capacitor $C_2$, which is connected between the gate controller 31 and the power NMOSFET transistor $NM_1$.

In the circuit of FIG. 3, a desired voltage can be charged in the capacitors $C_1$ $_{and\ C2}$ by adjusting a breakdown voltage of the zener diodes $D_1$ and $D_2$. Moreover, unlike the conventional circuit of FIG. 1, the capacitors $C_1$ and $C_2$ are charged and discharged only through the resistances $R_1$ and $R_2$ in the circuit of FIG. 3, and thus, the circuit is able to sufficiently reduce an operating current and safely operate irrespective of a duty-cycle by increasing values of the resistances $R_1$ and $R_2$.

Figure 4:
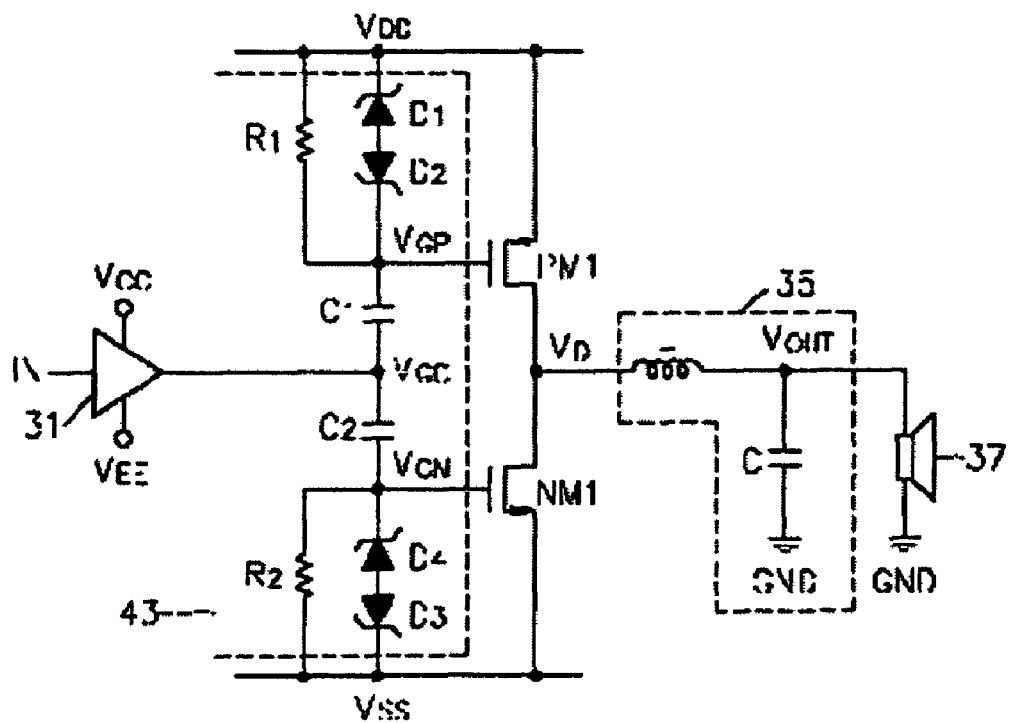
FIG. 4 is a drawing illustrating a circuit for driving a gate of a power MOSFET in a digital audio amplifier, according to a second embodiment of the present invention.

FIG. 4 is a drawing illustrating a circuit for driving a gate of a power MOSFET in a digital audio amplifier, according to a second embodiment of the present invention.

Referring to FIG. 4, a circuit for driving a gate 43 comprises a first resistance $R_1$, which is connected between a first power source voltage $V_{DD}$ and a gate of a power PMOSFET transistor $PM_1$, a second resistance $R_2$, which is connected between a second power source voltage $V_{SS}$ and a gate of the power NMOSFET transistor $NM_1$, a first capacitor $C_1$, which is connected between an output terminal of a gate controller 31 and the gate of the power PMOSFET transistor $PM_1$, a second capacitor $C_2$, which is connected between the output terminal of the gate controller 31 and the gate of the power NMOSFET transistor $NM_1$, a first diode $D_1$, one end of which is connected to the first power source voltage $V_{DD}$, a second diode $D_2$, one end of which is connected to the other end of the first diode $D_1$ and other end of which is connected to the gate of the power PMOSFET transistor $PM_1$, a third diode $D_3$, one end of which is connected to the second power source voltage $V_{SS}$, and a fourth diode $D_4$, one end of which is connected to other end of the third diode $D_3$ and other end of which is connected to the gate of the power NMOSFET transistor $NM_1$.

The first through fourth diodes $D_1$, $D_2$, $D_3$, and $D_4$ may be general diodes, but they are preferably zener diodes.

As illustrated in FIG. 4, although the power source voltages $V_{DD}$ and $V_{SS}$ which are applied to the power MOSFET transistors $PM_1$ and $NM_1$ are changed, the circuit for driving the gate 43 constantly maintains gate-source voltages of the power MOSFET transistors $PM_1$ and $NM_1$ by zener diodes $D_1$ and $D_3$. However, when the power MOSFET transistors $PM_1$ and $NM_1$ are turned off, another diodes $D_2$ and $D_4$ are used in order to prevent the capacitors $C_1$ and $C_2$ to be discharged through the zener diodes $D_1$ and $D_3$. In this case, general diodes may be used, but when zener diodes are used, there is an advantage in limiting the gate-source voltages of the power MOSFET transistors $PM_1$ and $NM_1$. In addition, a trade-off between voltages applied to the power MOSFET transistors $PM_1$ and $NM_1$ and currents charged and discharged in the capacitors $C_1$ and $C_2$ is possible by adjusting a breakdown voltage of the diodes $D_2$ and $D_4$.

Figure 5:
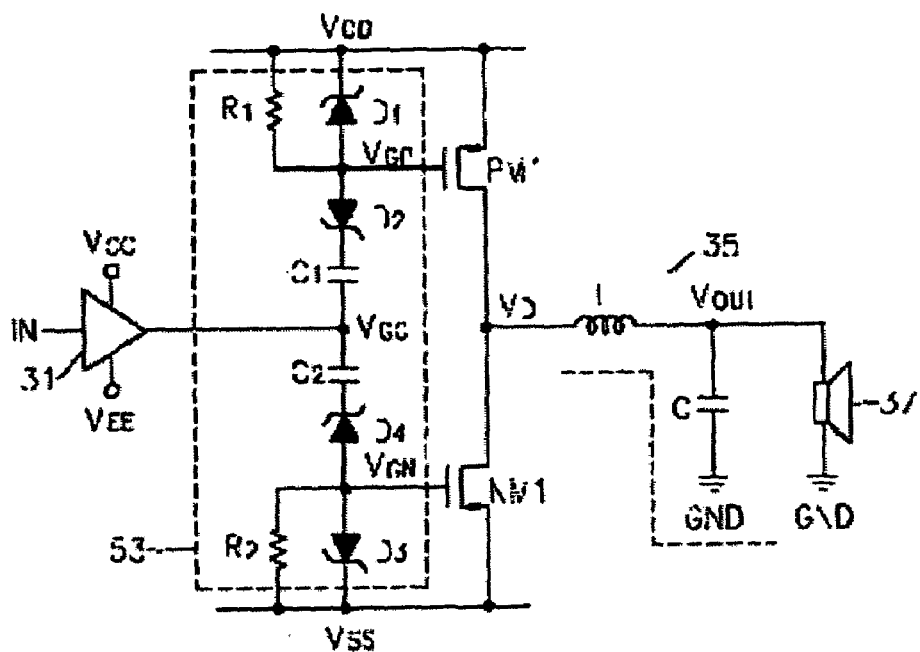
FIG. 5 is a drawing illustrating a circuit for driving a gate of a power MOSFET in a digital audio amplifier, according to a third embodiment of the present invention.

FIG. 5 is a drawing illustrating a circuit for driving a gate of a power MOSFET in a digital audio amplifier, according to a third embodiment of the present invention.

Referring to FIG. 5, a circuit for driving a gate 53 comprises a first resistance $R_1$, which is connected between a first power source voltage $V_{DD}$ and a gate of a power PMOSFET transistor $PM_1$, a second resistance $R_2$, which is connected between a second power source voltage $V_{SS}$ and a gate of a power NMOSFET transistor $NM_1$, a first capacitor $C_1$, one end of which is connected to an output terminal of a gate controller 31, a second capacitor $C_2$, one end of which is connected to the output terminal of the gate controller 31, a first diode $D_1$, one of which is connected to the first power source voltage $V_{DD}$ and other end of which is connected to the gate of the power PMOSFET transistor $PM_1$, a second diode $D_2$, one end of which is connected to the other end of the first capacitor $C_1$ and other end of which is connected to the gate of the power PMOSFET transistor $PM_1$, a third diode $D_3$, one end of which is connected to the second power source voltage $V_{SS}$ and other end of which is connected to the gate of the power NMOSFET transistor $NM_1$, and a fourth diode $D_4$, one end of which is connected to the other end of the second capacitor $C_2$, and other end of which is connected to the gate of the power NMOSFET transistor $NM_1$.

The first through fourth diodes $D_1$, $D_2$, $D_3$, and $D_4$ may be general diodes, but they are preferably zener diodes.

More particularly, when the power MOSFET transistors $PM_1$ and $NM_1$ are turned off, the circuit for driving the gate 53 prevents a gate voltage from going beyond a scope of the power source voltages $V_{DD}$ and $V_{SS}$ by connecting the zener diodes $D_2$ and $D_4$, which prevent the charged capacitors $C_{1\ and\ C2}$ from being discharged, to the capacitors $C_{1\ and\ C2}$ in series. Therefore, an overvoltage is not applied to the power MOSFET transistors $PM_1$ and $NM_1$.

Meanwhile, a breakdown occurs in a turned-off power MOSFET transistor among the power MOSFET transistors $PM_1$ and $NM_1$ when adjusting the breakdown voltage of the zener diodes $D_2$ and $D_4$, which block the discharge of the capacitors $C_1$ and $C_2$.

Resistances $R_{1\ and\ R2}$ of FIGS. 4 and 5 are not essential elements in a switching operation and play a supplementary role of turning the power MOSFET transistors $PM_1$ and $NM_1$ off by charging the capacitors $C_1$ and $C_2$ when the gate controller 31 does not operate.

Figure 6:
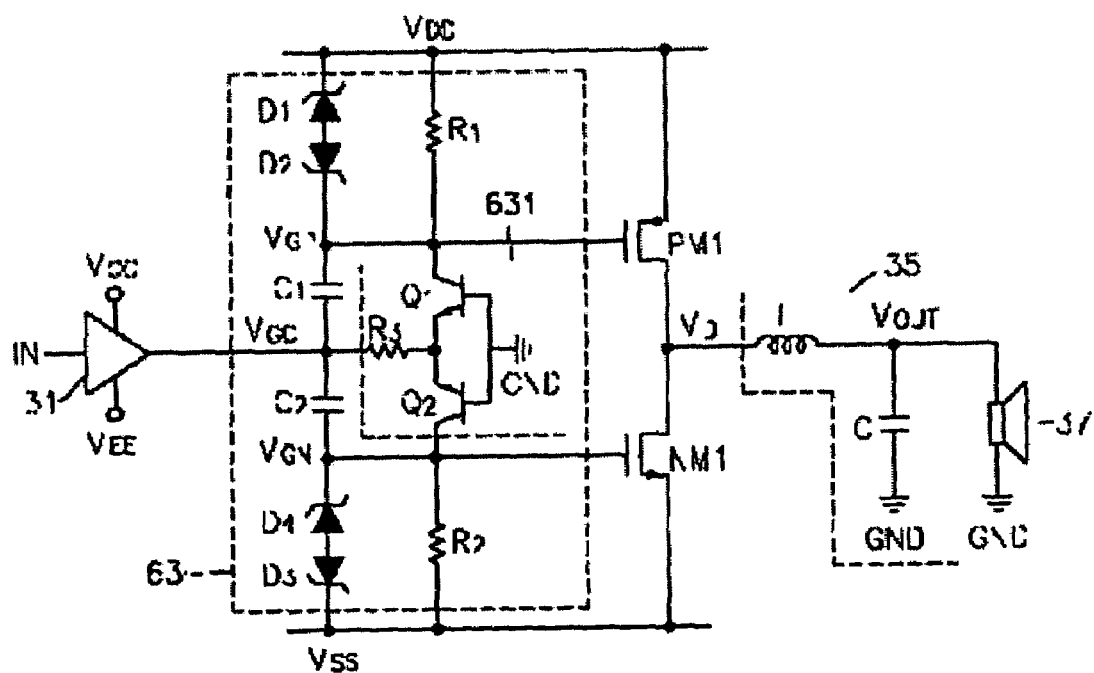
FIG. 6 is a drawing illustrating a circuit for driving a gate of a power MOSFET in a digital audio amplifier, according to a fourth embodiment of the present invention.

FIG. 6 is a drawing illustrating a circuit for driving a gate of a power MOSFET in a digital audio amplifier, according to a fourth embodiment of the present invention.

Referring to FIG. 6, a circuit for driving a gate 63 further comprises a current source 631, compared to the second embodiment of the present invention.

The current source 631 comprises a resistance $R_3$, one end of which is connected to an output terminal of a gate controller 31, a NPN bipolar transistor $Q_1$, an emitter of which is connected to other end of the resistance $R_3$, a base of which is connected to a grounding voltage $G_{ND}$, and a collector of which is connected to a gate of a power PMOSFET transistor $PM_1$, and a $P_{NP}$ bipolar transistor $Q_2$, an emitter of which is connected to the other end of the resistance $R_3$, a base of which is connected to a grounding voltage $G_{ND}$, and a collector of which is connected to a gate of a power NMOSFET transistor $NM_1$.

More specifically, when one of the power MOSFET transistors $PM_1$ and $NM_1$ is turned on, a capacitor connected to the turned-on power MOSFET transistor $PM_1$ or $NM_1$ is charged or discharged through the resistance or zener diode, and then, if a switching frequency of the gate controller 31 is slow, the turned-on power MOSFET transistor $PM_1$ or $NM_1$ is turned off. However, as shown in FIG. 6, if currents through the resistance and the zener diode are compensated by the current source 631, the gate voltage is maintained constant. At this time, only one of the two bipor transistors $Q_1$ and $Q_2$, which is connected to the turned-on power MOSFET transistor $PM_1$ or $NM_1$, is turned on and generates current and the other is turned off. The current is determined by adjusting a value of $R_3$, and the gate-source voltage of the turned-on power MOSFET transistor $PM_1$ or $NM_1$ is determined by multiplying the resistance $R_1$ or $R_2$ and the current.

Figure 7:
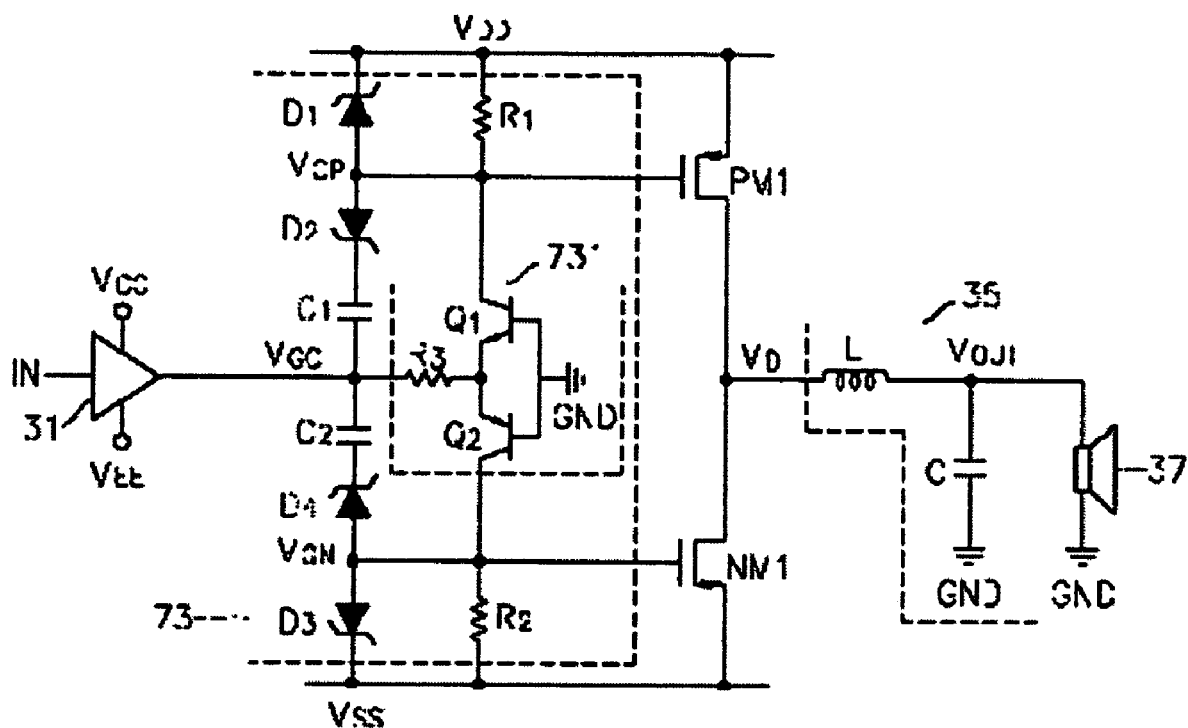
FIG. 7 is a drawing illustrating a circuit for driving a gate of a power MOSFET in a digital audio amplifier, according to a fifth embodiment of the present invention.

FIG. 7 is a drawing illustrating a circuit for driving a gate of a power MOSFET in a digital audio amplifier, according to a fifth embodiment of the present invention.

Referring to FIG. 7, a circuit for driving a gate 73 further comprises a current source 731, compared to the third embodiment of the present invention. The current source 731 has the same structure with the current source 631. The circuit for driving the gate 73, like the circuit for driving the gate 63, prevents the power MOSFET transistors $PM_1$ and $NM_1$ from being turned off by the current source 731 when the frequency of the output signal of the gate controller 31 is slow.

In the current sources 631 and 731 of FIGS. 6 and 7, an NMOSFET transistor may be used instead of the NPN polar transistor $Q_1$ and a PMOSFET transistor may also be used instead of the PNP bipolar transistor $Q_2$. In the case of the PMOSFET transistor, a source is connected to the other end of the resistance $R_3$, a gate is connected to a grounding voltage $V_{SS}$, and a drain is connected to the gate of the power PMOSFET transistor $PM_1$. In the case of the NMOSFET transistor, a source is connected to the other end of the resistance $R_3$ and a gate is connected to the grounding voltage $V_{SS}$, and a drain is connected to the gate of the power NMOSFET transistor $NM_1$.

While the present invention has been particularly shown and described with reference to exemplary embodiments thereof, it will be understood by those of ordinary skill in the art that various changes in form and details may be made therein without departing from the spirit and scope of the present invention as defined by the accompanying claims.

As described above, a circuit for driving a gate according to the present invention has an advantage in that the circuit safely and effectively transmits an output signal of a gate controller irrespective of a frequency and duty-cycle of the output signal of, when transmitting the output signal of the gate controller to the power MOSFET transistor using a higher power source voltage than the gate controller. Therefore, the circuit is suitable for a case where the duty-cycle of the output signal of the gate controller dramatically changes and the frequency is irregular.

What is claimed is:

1. A circuit for driving a gate of a power metal-oxide semiconductor field effect transistor (MOSFET) in a digital audio amplifier including a power PMOSFET transistor in which a first power source voltage is applied to a source and an output terminal is connected to a drain; a power NMOSFET transistor in which the output terminal is connected to a drain and a second power source voltage is applied to a source; a gate controller which uses a third power source voltage which is lower than the first power source voltage and a fourth power source voltage which is lower than the second power source voltage, and controls gates of the power PMOSFET and NMOSFET transistors; and an output filter which is connected to the output terminal and has an inductor and a capacitor, the circuit comprising:
    a first resistance connected between the first power source voltage and the gate of the power PMOSFET transistor;
    a second resistance connected between the second power source voltage and the gate of the power NMOSFET transistor;
    a first capacitor connected between an output terminal of the gate controller and the gate of the power PMOSFET transistor;
    a second capacitor connected between the output terminal of the gate controller and the gate of the power NMOSFET transistor;
    a first diode connected between the output terminal of the gate controller and the gate of the power PMOSFET transistor; and
    a second diode connected between the output terminal of the gate controller and the gate of the power NMOSFET transistor.

2. The circuit of claim 1, wherein the first and second diodes are zener diodes.

3. A circuit for driving a gate of a power MOSFET in a digital audio amplifier including a power PMOSFET transistor in which a first power source voltage is applied to a source and an output terminal is connected to a drain; a power NMOSFET transistor in which the output terminal is connected to a drain and a second power source voltage is applied to a source; a gate controller which uses a third power source voltage which is lower than the first power source voltage and a fourth power source voltage which is lower than the second power source voltage, and controls gates of the power PMOSFET and NMOSFET transistors; and an output filter which is connected to the output terminal and has an inductor and a capacitor, the circuit comprising:
    a first resistance connected between the first power source voltage and the gate of the power PMOSFET transistor;
    a second resistance connected between the second power source voltage and the gate of the power NMOSFET transistor;
    a first capacitor connected between an output terminal of the gate controller and the gate of the power PMOSFET transistor;
    a second capacitor connected between the output terminal of the gate controller and the gate of the power NMOSFET transistor;
    a first diode, one end of which is connected to the first power source voltage;
    a second diode, one end of which is connected to the other end of the first diode and other end of which is connected to the gate of the power PMOSFET transistor;
    a third diode, one end of which is connected to the second power source voltage; and
    a fourth diode, one end of which is connected to the other end of the third diode and other end of which is connected to the gate of the power NMOSFET transistor.

4. A circuit for driving a gate of a power MOSFET in a digital audio amplifier including a power PMOSFET transistor in which a first power source voltage is applied to a source and an output terminal is connected to a drain; a power NMOSFET transistor in which the output terminal is connected to a drain and a second power source voltage is applied to a source; a gate controller which uses a third power source voltage which is lower than the first power source voltage and a fourth power source voltage which is lower than the second power source voltage, and controls gates of the power PMOSFET and NMOSFET transistors; and an output filter which is connected to the output terminal and has an inductor and a capacitor, the circuit comprising:
    a first resistance connected between the first power source voltage and the gate of the power PMOSFET transistor;
    a second resistance connected between the second power source voltage and the gate of the power NMOSFET transistor;
    a first capacitor, one end of which is connected an output terminal of the gate controller;
    a second capacitor, one end of which is connected to the output terminal of the gate controller;
    a first diode, one end of which is connected to the first power source voltage and other end of which is connected to the gate of the power PMOSFET transistor;
    a second diode, one end of which is connected to the other end of the first capacitor and other end of which is connected to the gate of the power PMOSFET transistor;
    a third diode, one end of which is connected to the second power source voltage and other end of which is connected to the gate of the power NMOSFET transistor; and
    a fourth diode, one end of which is connected to the other end of the second capacitor and other end of which is connected to the gate of the power NMOSFET transistor.

5. The circuit of claim 3 or 4, wherein the first through fourth diodes are zener diodes.

6. The circuit of claim 3 or 4 further comprising a current source which is connected to the gates of the power PMOSFET and NMOSFET transistors and the output terminal of the gate controller.

7. The circuit of claim 6, wherein the current source comprises:
- a resistance, one end of which is connected to the output terminal of the gate controller;
- a NPN bipolar transistor, an emitter of which is connected to other end of the resistance, a base of which is connected to a grounding voltage, and a collector of which is connected to the gate of the power PMOSFET transistor; and
- a PNP bipolar transistor, an emitter of which is connected to the other end of the resistance, a base of which is connected to a grounding voltage, and a collector of which is connected to the gate of the power NMOSFET transistor.

8. The circuit of claim 6, wherein the current source comprises:
- a resistance, one end of which is connected to the output terminal of the gate controller;
- a NMOSFET transistor, a source of which is connected to other end of the resistance, a gate of which is connected to a grounding voltage, and a drain of which is connected to the gate of the power PMOSFET transistor; and
- a PMOSFET transistor, a source of which is connected to the other end of the resistance, and a gate of which is connected to a grounding voltage, and a drain of which is connected to the gate of the power NMOSFET transistor.

* * * * *